United States Patent
Hemon et al.

(10) Patent No.: US 9,176,179 B2
(45) Date of Patent: Nov. 3, 2015

(54) METHOD AND DEVICE FOR DIAGNOSING A RESERVOIR CAPACITOR OF A VEHICLE PASSENGER PROTECTION SYSTEM, AND VEHICLE SAFETY SYSTEM INCORPORATING SUCH DEVICE

(75) Inventors: Erwan Hemon, Goyrans (FR); Hamada Ahmed, Toulouse (FR); Pierre Turpin, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 252 days.

(21) Appl. No.: 14/112,042

(22) PCT Filed: Apr. 22, 2011

(86) PCT No.: PCT/IB2011/001221
§ 371 (c)(1),
(2), (4) Date: Oct. 16, 2013

(87) PCT Pub. No.: WO2012/143750
PCT Pub. Date: Oct. 26, 2012

(65) Prior Publication Data
US 2014/0043034 A1    Feb. 13, 2014

(51) Int. Cl.
*G01R 31/12* (2006.01)
*G01R 27/26* (2006.01)
*G01R 31/02* (2006.01)
*B60R 21/017* (2006.01)
*G01R 31/01* (2006.01)
*G01R 31/00* (2006.01)

(52) U.S. Cl.
CPC .......... *G01R 31/028* (2013.01); *B60R 21/0173* (2013.01); *G01R 31/016* (2013.01); *G01R 31/006* (2013.01)

(58) Field of Classification Search
CPC .. G01R 31/028; G01R 31/016; G01R 31/006; B60R 21/0173
USPC .......................................... 324/548, 658–690
See application file for complete search history.

(56) References Cited

U.S. PATENT DOCUMENTS

| 5,045,835 | A | 9/1991 | Masegi et al. |
| 5,703,412 | A | 12/1997 | Takemoto et al. |
| 6,448,784 | B1 * | 9/2002 | Belau .................. B60R 21/0173 307/10.1 |
| 2009/0160459 | A1 | 6/2009 | De Langen et al. |

FOREIGN PATENT DOCUMENTS

| DE | 3744524 A1 | 7/1989 |
| DE | 19705430 C1 | 10/1998 |

(Continued)

OTHER PUBLICATIONS

International Search Report and Written Opinion correlating to PCT/IB2011/001221 dated Jan. 18, 2012.

*Primary Examiner* — Jermele M Hollington
*Assistant Examiner* — Farhana Hoque

(57) ABSTRACT

A method of measuring a capacitor value comprises the steps of loading the capacitor up to a given voltage value; obtaining a first measure of a time for discharging the capacitor by a fixed voltage drop, the discharge of the capacitor being caused by a first current; reloading the capacitor up to the given voltage value; obtaining a second measure of a time for discharging the capacitor by the fixed voltage drop, the discharge of the capacitor being caused by the first current and by a second current of known value added to said first current; and determining the capacitor value from the difference between the first measure and the second measure, based on the given voltage drop or the given time, respectively, and based further on the known value of the given second current.

16 Claims, 4 Drawing Sheets

(56) References Cited

FOREIGN PATENT DOCUMENTS

| DE | 10030389 | A1 | 1/2002 |
| DE | 10156026 | A1 | 6/2003 |
| DE | 10158268 | A1 | 6/2003 |
| EP | 0684163 | A2 | 11/1995 |
| WO | 2006/046218 | A1 | 5/2006 |

* cited by examiner

METHOD AND DEVICE FOR DIAGNOSING A RESERVOIR CAPACITOR OF A VEHICLE PASSENGER PROTECTION SYSTEM, AND VEHICLE SAFETY SYSTEM INCORPORATING SUCH DEVICE

FIELD OF THE INVENTION

This invention relates to a method and a device for diagnosing a reservoir capacitor of a vehicle safety system, and to a vehicle safety device incorporating such device.

BACKGROUND OF THE INVENTION

Nowadays, vehicle passenger protection systems, also known as vehicle safety systems, usually comprise airbags arranged in various frontal and side locations of the passenger seating positions. Airbags consist of a flexible envelope which is designed to inflate rapidly through pyrotechnic means during a crash of the vehicle, in order to prevent passengers from being severely injured.

A typical airbag system includes proximity and impact sensors (which detect when an accident situation is going to occur), squibs, and a control module which may include a microprocessor or a microcontroller. During an accident situation, the control module provides energy for deploying the squibs, which in turn ignite pyrotechnic material to inflate the airbags.

For safety reasons, it cannot be assumed that, in an accident situation, the power source of the vehicle, i.e., the battery, remains active during the crash. Also, the wiring harness of the vehicle may be damaged so that the airbag system may be disconnected from this power source. Therefore, airbag systems generally include an energy storage device such as a reservoir capacitor which is intended to store sufficient energy so as to supply a current allowing to heat each squib instead of the battery whenever necessary. Thus, the airbag system may rely on the reservoir capacitor to operate during crash situations without any supply from the car.

It is desirable to diagnose the value of this capacitor in order to validate that enough energy is available for firing and ensuring deployment of all airbags. In extreme cases, the capacitor can get disconnected (for instance, if the soldering quality is faulty) and this diagnostic allows detecting it.

In prior art solutions disclosed, e.g., in WO 2006/046218, the diagnosis may be done by causing the reservoir capacitor to be discharged by a current I of fixed value, resulting in a voltage decreasing with time. By measuring the time interval $\Delta t$ for a fixed voltage drop $\Delta V$, or by measuring the voltage drop $\Delta V$ for a fixed time interval $\Delta t$, the capacitance value C of the reservoir capacitor may be determined as:

$$C = I \cdot \Delta t / \Delta V$$

However, such solutions necessitate that the current I be accurately known and maintained stable during the measurement. This may prove difficult when the capacitor is discharged under conditions which vary during the capacitor measurement with the operation of the load, thus yielding in inaccuracy of the diagnostic. In addition, the variation of the load current during the capacitor measurement is creating additional errors.

In order to circumvent these difficulties, one may think of causing the reservoir capacitor to be charged through an external resistor by a current of a known value, the RC value being calculated from a measurement of the time in between two voltage set points. Knowing the external resistor value, the capacitor can be computed. In order for the measurement to be substantially independent from temperature, the external resistor must be of rather high value. Such additional external component increases the cost of the system.

SUMMARY OF THE INVENTION

The present invention provides a method, a device, and a system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

Figure is a graph of the reservoir capacitor voltage Vboost as a function of time t.

Figure 5:
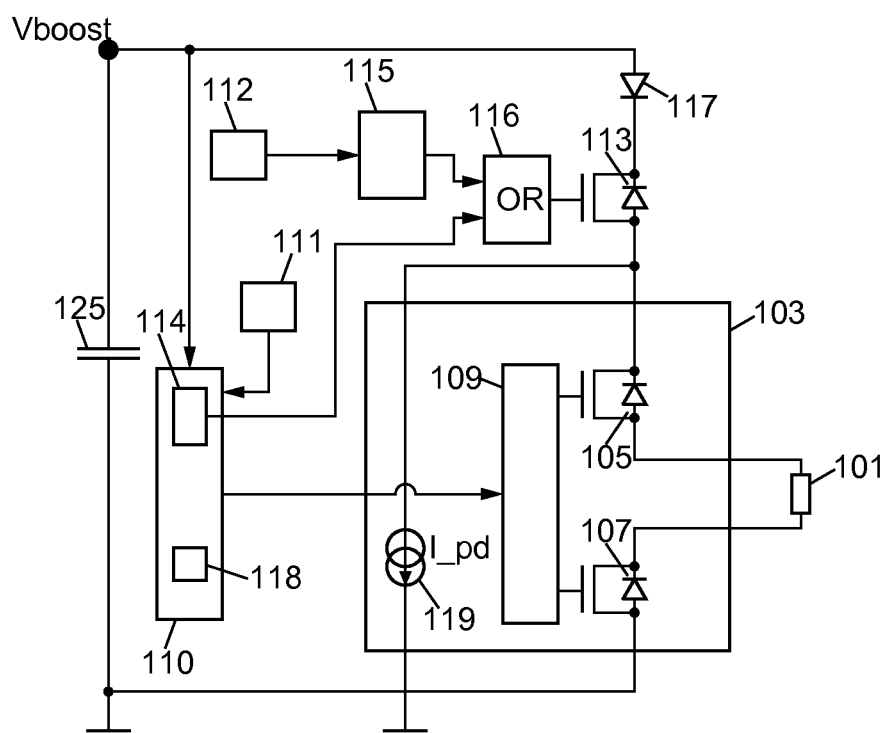

FIG. 5 schematically shows a block diagram of a vehicle airbag system embodying the invention.

Figure 6:
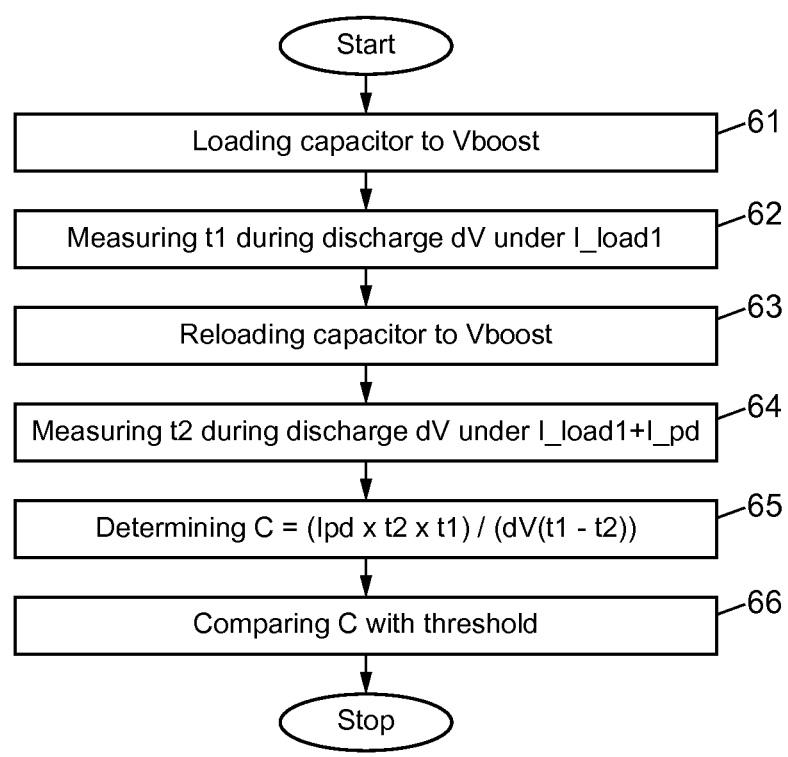

FIG. 6 shows a flow chart illustrating an example of a method of diagnosing the reservoir capacitor.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
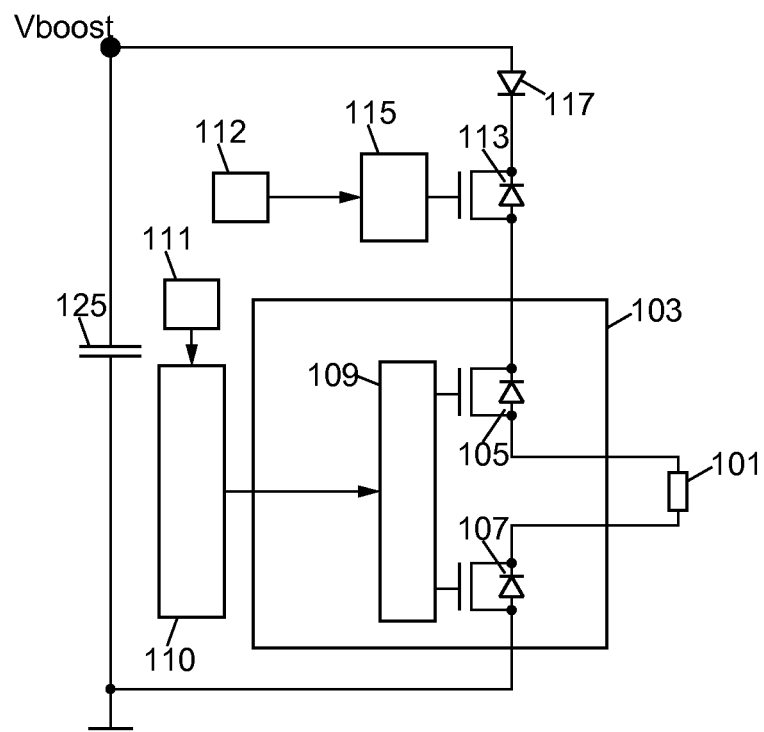
FIG. 1 schematically shows an example of a circuit diagram of a vehicle airbag system.

FIG. 1 diagrammatically illustrates a simplified airbag system for a vehicle. In the example shown, the drive circuit can enable/disable a path parallel to capacitor, thus allowing capacitor 125 to discharge.

The system comprises at least one igniter element 101 coupled to a drive circuit 103 arranged to provide power to the igniter element 101 from a reservoir capacitor 125. Typically, the igniter element, also known as a squib, comprises a hot wire bridge which is heated by a firing signal, for example a firing current of 1-2 Amps (A). The heat generated in the igniter element ignites a pyrotechnic material adjacent the igniter element which burns a propellant. This produces gas to inflate the airbag.

The reservoir capacitor is sized so as to store sufficient energy to actuate the squib 101 in replacement of the battery when needed, that is to say in case of a crash or if the battery is inoperative, for whatsoever reason.

The drive circuit 103 is arranged to generate the firing signal and provide it to the squib 101 in order to activate the squib and as a consequence deploy the airbag. More specifically, the drive circuit 103 comprises a switch arrangement including a high side switch 105 and a low side switch 107. In this example, switches 105,107 are implemented with Field Effect Transistor (FETs). During normal operation, when the airbag is not deployed, the high side switch 105 and the low side switch 107 are both in an off state and no current flows through the squib. The use of two switch transistors in series allows to increase reliability and failure prevention. Particularly, if either one of the switch FETs short circuits, this may avoid an inadvertent activation of the airbag, as the other switch FET will be in the off state. Thus, inadvertent activation of an airbag can be avoided, as well as associated disturbance of a driver and possible accidents.

In the example shown, the high side FET 105 and the low side FET 107 are each controlled by a control circuit 109. The control circuit 109 is coupled to an analog mixed signal module 110 which is connected to one or more crash sensors 111, such as an accelerometer or acceleration sensor, for determining when a particular crash condition is occurring in which an airbag should be deployed. In the shown example, only a single crash sensor 111 is shown but it will be apparent that any other number of sensors may be present. The module 110 may be an Application Specific Integrated Circuit (ASIC). In the shown example, module 110 is connected with an input to an output of the sensor(s). This chip 110 can receive at the input a signal representing a value of a sensed parameter and compare the value with one or more criteria indicative of a crash condition, such as extremely fast deceleration.

The control circuit 109 is connected to the processor 110, and can receive an airbag activation signal from the processor 110, which the processor 110 outputs when a crash condition has been found (e.g. when the signal from the sensor(s) 111 meets the criteria).

The control circuit 109 produces a signal which switches the low side FET 107 off during normal operation and on if the airbag is being activated by the airbag activation signal and also controls the high side FET 105 to be off during normal operation and on during airbag activation.

In the shown example, the drive circuit 103 is indirectly connected (in parallel in this example) to the reservoir capacitor 125. A power switch transistor or other type of third or main switch 113 is coupled in series with the drive circuit 103, namely in series with switches 105 and 107. The main switch 113 can e.g. be an external discrete component, such as a discrete power FET. The main switch 113 can provide further failure prevention by providing additional redundancy in the airbag activation operation. Specifically, the operation of the main switch 113 can be controlled, as in this example, by a separate control circuit 115 based on sensor inputs different from those used to control the drive circuit. For example, the main switch 113 may be controlled based on signals from sensors 112 different from the sensors 111 that are used to drive the drive circuit 103. One acceleration sensor 112 is shown in FIG. 1 but it will be apparent that more sensors may be used.

In order to enhance failure prevention, the main switch 113 may be controlled by a separate control circuit which uses different crash detection algorithm and has different sensor inputs than control circuit 110 of the drive circuit 103. The control circuit 115 may e.g. be a small microprocessor connected to a control input, e.g. the gate of the main switch 113.

The main switch 113 is coupled in series to a reverse flow blocking diode 117. The reverse flow blocking diode 117 connects the reservoir capacitor 125 to the battery which provides the supply voltage Vbat to the drive circuit 103 and squib 101.

Figure 2:
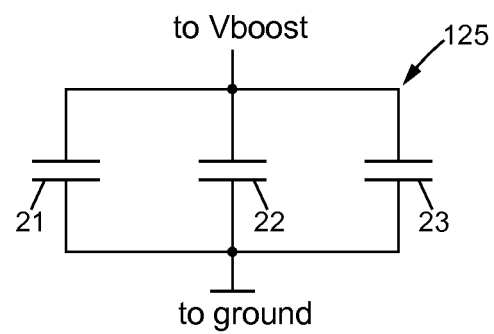
FIG. 2 shows an example of a circuit diagram of a reservoir capacitor.

With reference to FIG. 2, the reservoir capacitor can comprise an arrangement of a plurality, e.g. at least three, elementary capacitors 21, 22 and 23, connected in parallel. For instance, each elementary capacitor can have a capacitance value of several, e.g., 7 millifarads (mF), so that the total capacitance C of the reservoir capacitor is of ca. 20 mF. The exact value of C may have any value suitable to allow the reservoir capacitor to supply as many igniters as required by the specific application. Having a set of parallel connected capacitors allows using component of lower size and cost. It also has the advantage of minimizing the impact of one single capacitor being damaged, on the overall operability of the safety system.

The above examples are not intended to be limiting, since a different number of elementary capacitors and/or different values for the elementary capacitors can be envisioned. Also, the set of parallel connected capacitors may have respective, namely different values. Generally, the elementary capacitors have values in the range of a few milliFarads.

Figure 3:
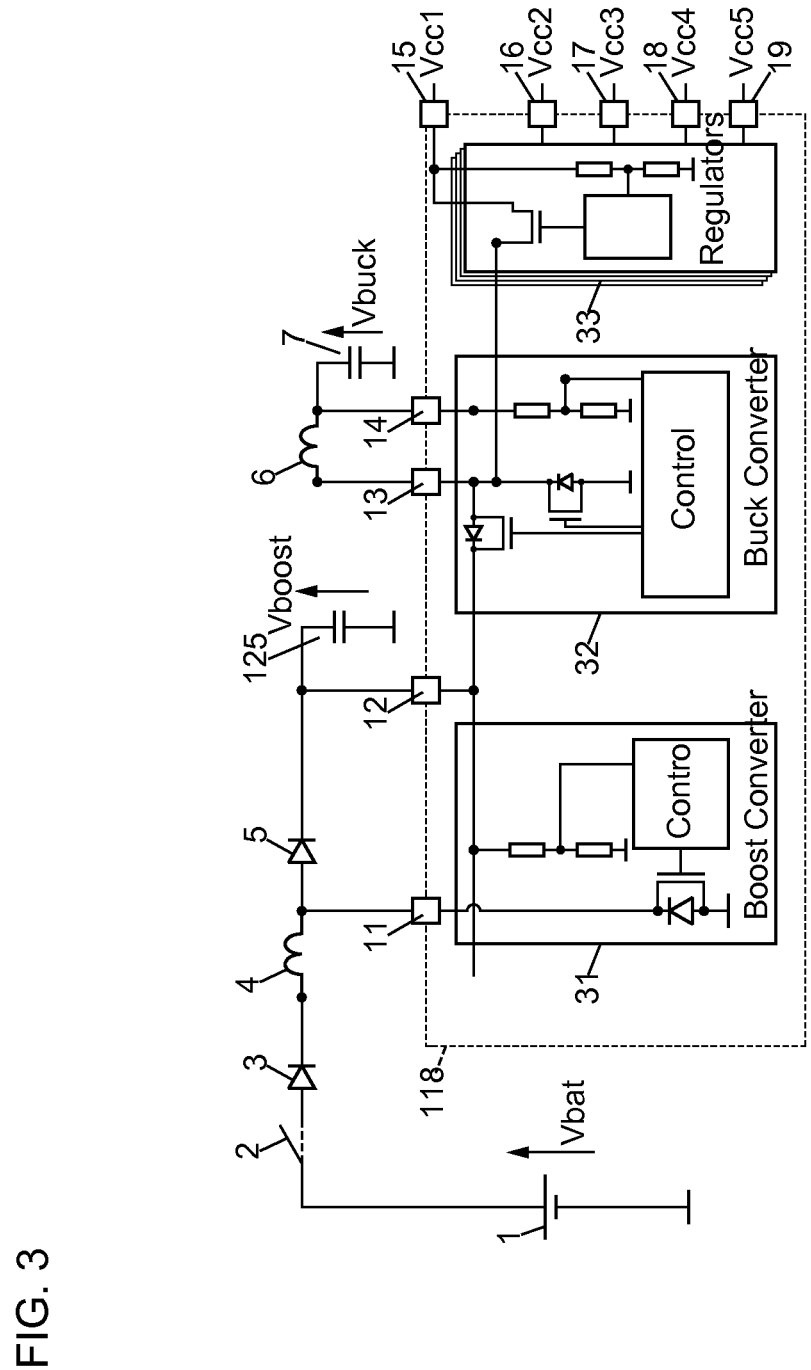
FIG. 3 schematically shows a block diagram of a supply voltage generating arrangement suitable for the example of FIG. 1.

FIG. 3 is a block diagram of an example of a portion of the module 110, comprising a supply voltage generating circuit 118, suitable to be used in the example of FIG. 1.

In the shown example, a supply voltage Vbat is provided by power supply 1.

The power supply 1 of FIG. 3 mainly comprises the battery 1 of the vehicle, which supplies a voltage Vbat of, e.g., 14 Volts (V) when fully loaded. The battery voltage Vbat of the vehicle is received by a first input 11 of the circuit 118 through the ignition switch 2 of the vehicle and a reverse flow blocking diode 3.

The circuit is connected to the power supply 1, through an ignition switch 2, reverse flow blocking diode 3, inductor 4, and external diode 5. In the example, components 2-5 are connected in series, thus forming a chain which connects the power supply 1 to the high voltage side of the reservoir capacitor 125.

As shown, a first node of the chain upstream of the diode 5 is connected on input of circuit 118 whereas a second node, downstream of the diode 5, is connected to a voltage output 12 of the circuit 118. Thus the reservoir capacitor 125 is connected to the input/output 12 of the circuit 118.

The circuit 118 comprises a voltage elevating structure 31 and a voltage lowering structure 32, both connected to output 12. Voltage elevating structure 31 forms a boost converter in combination with the inductor 4, diode 5 and the reservoir capacitor 125. In the shown example, inductor 4 and diode 5 are external to the circuit 118. This boost converter is arranged to step up the battery voltage to a higher voltage Vboost, of 23 V for example, suitable to charge the reservoir capacitor so that it stores sufficient energy to actuate the squib 101 in replacement of the battery when needed.

The voltage output 12 is also connected to the voltage lowering structure. in this example a Buck converter which is arranged to generate, from voltage Vboost, a voltage Vbuck lower than Vboost. Thus, voltage Vboost is stepped down to voltage Vbuck, of 9 V for example. The circuit 118 comprises control logic of the Buck converter 32, which cooperates with an inductor 6 and a capacitor 7. In the shown example, inductor 6 and diode 7 are external to the circuit 118. This Buck converter allows converting the supply voltage Vboost down to a lower voltage Vbuck, which is suitable to allow regulators generating operational supply voltages, respectively used to supply power to other devices in the system.

The above value of voltage Vboost is only one example, but Vboost is typically more than 20 V.

The input/output 12 of the circuit 118 is coupled to the common output of the boost converter 31 and input of the Buck converter 32. Thus connected, the external reservoir capacitor 125 is charged by the Boost converter to Vboost, e.g., 23 V in normal conditions of operation as soon as the ignition switch 2 is closed and the power supply enabled. The Buck converter 31 operates as a load on the reservoir capacitor 125. The reservoir capacitor 125 is capable of supplying its stored energy to the Buck converter if the battery becomes inoperative or is disconnected from the circuit 118 due to a crash of the vehicle.

The circuit 118 further comprises at least one voltage regulator 33, and typically a set of voltage regulators, arranged for delivering regulated supply voltages Vcc1, Vcc2, Vcc3, Vcc4 and Vcc5 on respective outputs 15, 16, 17, 18 and 19, respectively, of the circuit 118. These various supply voltages allow supplying power to additional devices (not represented) such as external microcontrollers, analog modules, digital modules, etc. of the safety system (for instance de seat belt pretension system) and/or of any other system in the vehicle, which may be connected to the respective outputs 15, 16, 17, 18 and 19 of the regulators.

In this example, the current causing discharge of the reservoir capacitor includes the undetermined current flowing from the reservoir capacitor 125 to the voltage lowering structure. The magnitude of this current is unknown, or at least variable over time, since this is dependent on the activity of the devices supplied by the regulators.

Theoretically speaking, it is possible to do a capacitor measurement with only one measurement of voltage decay if the current pull down is accurately known. However, the Buck converter input is connected to the reservoir capacitor 125 in order to keep supply power to the Buck converter, and hence the regulators and connected devices during a diagnosis. As such, the current input the Buck converter, and thus the discharging current of the reservoir capacitor, is not precisely known. In addition, the load current absorbed by any of devices supplied by the regulators varies with, e.g., the activity of a microcontroller in the device. This load current variation during the capacitor measurement is a cause of potential errors.

Thus, the measurement of the capacitor is made in presence of an unknown load current from the buck converter input, and this variation of the current over time leads to an inaccuracy of diagnostics about the value of the capacitor which for vehicle safety systems is not acceptable.

Figure 4:
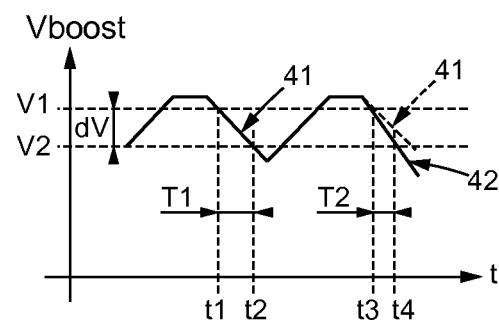

The graph of FIG. 4 shows the supply voltage Vboost as a function of time during a method as illustrated with the flow chart of FIG. 6.

During the first phase, from t=0 to t1, the capacitor has been loaded to a given voltage value V2, e.g., 23 V. At t=t1, discharging of the capacitor starts and a first period of time T1 corresponding to the time (from t1 to t2) needed to discharge the capacitor by a given voltage drop dV (from V1 to V2) by a load current I_load1 (of unknown value) is measured. In other words, this first phase allows obtaining a measure T1 of the discharge rate of capacitor 125 when discharged by current I_load1. The discharge of the reservoir capacitor during this step is illustrated by the portion 41 of the curve in the graph of FIG. 4.

According to Kirchhoff's law at the input of the Buck converter (which corresponds to pin 12 of the module 110), the load current I_load1 is given by:

$$I\_load1 = I\_buck\_in + I\_bias\_boost \quad (1)$$

where I_buck_in designates the input current absorbed by the Buck converter 32 and I_bias_boost designates the bias current of the Boost converter 31. After the first duration, i.e. after t2, the capacitor is recharged.

In a second phase after, the capacitor has been reloaded to the same given voltage value V2 as at the beginning of the first phase, and a second period of time T2 corresponding to the time from t3 to t4 needed to discharge the capacitor by the same given voltage drop dV by a load current I_load2 including the first current I_load1 of unknown value and a second load current I_pd of a known given value which is added to the first current. In other words, this second phase allows obtaining a measure T2 of the discharge rate of capacitor 125 when discharged by I_load2+I_pd. The discharge of the reservoir capacitor during this second step is illustrated by the curve 42 in the graph of FIG. 4. For comparison purposes the slope of the curve 41 is indicated in dotted lines along the curve 42.

This second measurement is performed in the same conditions of operation as the first one, i.e. with the same current I_buck_in absorbed by the input of the buck converter.

The capacitor is discharged by a load current I_load2 thus obtained is now given by:

$$I\_load2 = I\_load1 + I\_pd \quad (2)$$

As can be seen from the comparison between the slopes of curves 41 and 42, T2 is shorter than T2, because the reservoir capacitor is discharged by an additional load current of a known given value.

A third phase, a differential calculation is done. From the difference T1−T2 observed between the two measurements, the capacitor value C can be calculated as follows:

First phase gives T1 such that C=(T1×I_Load1)/dV, namely:

$$I\_Load1 = C \cdot dV/T1 \quad (3)$$

Second phase gives T2 such that C=(t2×I_Load2)/dV, namely $$I\_Load2 = C \cdot dV/T2 \quad (4)$$

Inserting relations (3) and (4) into relation (1) gives:

$$(dV \times C)/t2 = (dV \times C)/t1 + Ipd \quad (5)$$

which, after transformation of (5), leads to:

$$C = (Ipd \times T2 \times T1)/(dV \times (T1 - T2)) \quad (6)$$

From above relation (6), it can be seen that the capacitor measurement does not depend anymore on I_load1, which is inaccurate, but only on I_pd, i.e., the accurate current of the diagnosis current source.

The values of I_pd, V1, V2 and dV may be any value suitable for the specific implementation. For instance, the voltage drop dV may be a decay of the capacitor voltage from a first voltage just below the voltage Vboost, e.g., a voltage of 22.5 V (i.e., just below Vboost=23 V), to a voltage of e.g. 20 V. The known additional load current I_pd may be equal to several tens of mA, 50 mA, for instance. These values are purely illustrative and are not intended to limit the invention.

In an example, the additional load current I_pd may be sunk from the reservoir capacitor 125 to the ground through a control switch, which may be a power MOS transistor. Typically, this switch drives a current of 50 mA under a maximum voltage exceeding 20 V, which corresponds to a power above 1 Watt (W). A power MOS transistor having such capability can e.g. be an external transistor. The function of the control switch may e.g. be performed by the so-called third or main switch 113 of the airbag system, referred to with reference to the circuit diagram of FIG. 1. This will be explained below in more detail with reference to FIG. 5.

Referring to FIG. 5, the elements shown therein corresponding to those of FIG. 1 will not be described in further detail for sake of brevity. In the example of FIG. 5a controlled current sink 119 is provided to achieve the discharge of the reservoir capacitor to the ground during the measurements. This current sink 119 is sized to selectively drive a current of fixed value I_pd, known to the module 110, from high voltage side of the reservoir capacitor 125 to the ground In the shown example, the current sink is part of the driver circuit 103. However, the current sink may be implemented in any other manner suitable for the specific implementation.

This control switch can be an external power MOS transistor.

In the shown example, a control switch is present which can enable or disable the fixed size current. The control switch is positioned between the high voltage node of the reservoir capacitor and the current sink 119.

For example the existing third or main switch 113 of the airbag system may be used to control the current. To that end, the current sink 119 can be positioned between the source terminal of transistor 113 and the ground.

The shown example comprises a control unit 114, e.g. as a hardware and/or software module of the module 110, configured to determine the capacitance and control execution of the method. This control unit 114 receives the reservoir capacitor voltage Vboost, and monitors the decrease of its value during the measurements. For instance, the falling value of Vboost may be compared to high and low thresholds which trigger the start and stop, respectively, of a counter. Voltage drop dV corresponds to the difference between these thresholds, and the measured duration T1 and T2 correspond to the values reached by the counter when Vboost becomes lower than the low threshold (assuming that the counter is reset to zero when Vboost first becomes lower than the high threshold).

The control unit 114 further controls the control switch 113, for instance through a logic gate 116 of the "OR" type, which also receives a control signal from the control circuit 115 for controlling the switch 113 as described above.

Referring to the flow chart of FIG. 6, the method shown therein comprises, at 61, loading the reservoir capacitor 125 up to a given voltage value, which e.g. corresponds to the voltage Vboost provided by the boost converter 31. The loading of capacitor 125 to Vboost can thus be obtained simply through the standard operation of the Boost converter 31 of FIG. 2.

Then, at 62, a first measure of the period of time T1 needed to discharge the capacitor by the fixed voltage drop dV is obtained. The discharge of the capacitor is caused by the, unknown, load current I_load1. To that end, in the example of FIG. 5, the control unit 114 of the module 110 activates the main switch 113, and monitors the voltage Vboost.

At 63, the capacitor is reloaded up to the same voltage value as at 61, namely to Vboost. The capacitor can e.g. be reloaded in the same manner as at 61, e.g. in the example of FIG. 2 by the Boost converter.

Then, at 64, the measure of the time T2 needed to discharge the reservoir capacitor 125 by the same fixed voltage drop dV as at 62, but the discharge of the capacitor being caused this time by a second current consisting of the same load current I_load1 as at 62 and at least one load current I_pd of known value, added to I_load1.

In a variant, instead of measuring the period of time T1, T2 needed for the voltage decay dV, the voltage drop $\delta V$ across the capacitor after discharging said capacitor during a fixed period of time $\delta T$ may be measured at 62 and 64, resulting in measured values $\delta V_{62}$ and $\delta V_{64}$. In both cases, the measurements are carried out under the control of the control unit 114, which activates the control switch 113 to cause the reservoir capacitor to discharge, and which monitors the decrease in the capacitor voltage Vboost.

At 65, the capacitance value C is determined from the difference T1−T2, or $\delta V_{62}-\delta V_{64}$, based on the known value of the fixed voltage drop dV (or the known value of the fixed time dT, when appropriate), and based further on the known value of the additional load current I_pd. It will be apparent that a measure for the discharge rate dV/dt may be obtained in any other suitable manner and that the measurements 62, 64 may be performed in any suitable manner. Also, the capacitance may be calculated from the determined rates in any suitable manner.

The fixed voltage dV or fixed period of time dT may be set to any suitable value, for example such that the duration of each of the measurements is longer than the duration of the cycle of any microcontroller supplied by the Buck converter 32 through the set of regulators 33, so that stability of the input current of the buck converter 33 from the first to the second measurements is advantageously obtained, provided that said measurements are performed successively in a short sequence of time.

Finally, at 66, the determined capacitor value C may be compared by the control unit 114 with a threshold in order to check that said value is sufficient in relation with a given criterion, which is tied to the quantity of energy which is necessary to supply the squibs in case a crash of the vehicle occurs. If not, that is to say if the capacitor value is below the threshold, the control unit may trigger an alarm signal indicating so. Thanks to such alarm signal, a user of the vehicle may become aware of the dysfunction and may arrange for reparation of the system. When using a reservoir capacitor which is comprised of three parallel connected elementary capacitors as depicted in FIG. 2, a dysfunction of one single elementary capacitor results in an error of ca. 33% on the measured capacitance value. The higher is the number of elementary capacitors, the smaller the error to be detected. The above signal may e.g. be output in a for humans perceptible form or to a computer unit.

In the foregoing specification, the invention has been described with reference to specific examples of embodiments of the invention. It will, however, be evident that various modifications and changes may be made therein without departing from the broader spirit and scope of the invention as set forth in the appended claims.

For example, the reservoir capacitor 125 may be used to supply other types of vehicle safety systems or devices, e.g., a safety belt pretension system, a Passive Entry System (PAS) unlocking device, which likewise need to remain operable in case of a crash affecting the power source and/or wiring harness of the vehicle.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the control switch 113 may be part of the driver circuit 103. Also, the control unit 114 which implements the method may be included in a microcontroller dedicated to diagnosis functions or in any other microcontroller separate from the module 110 of the vehicle safety system (like microcontroller 115). Such a microcontroller may dedicated to this function or perform diagnosis of various functionalities in the vehicle. In other embodiments, the control unit 114 may be part of a general purpose diagnosis workstation, which is connected to the vehicle when maintenance operations are to be performed, either regularly or in case where a dysfunction is detected.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the switch 21 and the current source 22 may be integral with the control unit 24, which may further be comprised in the module 110. Alternatively, the examples may be implemented as any number of separate integrated circuits or separate devices interconnected with each other in a suitable manner. For example, the switch 21 and/or the current source may be external components.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, and various other devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A method of diagnosing a reservoir capacitor of a vehicle safety system, the method comprising:
    loading the reservoir capacitor up to a given voltage value;
    obtaining a first measure of a discharge rate of the reservoir capacitor when discharging the reservoir capacitor by a first undetermined current;
    reloading the reservoir capacitor up to the given voltage value;
    obtaining a second measure of the discharge rate of the reservoir capacitor when discharging said reservoir capacitor by the first undetermined current and by a second fixed current of known value added to said first undetermined current;
    determining a capacitance value of the reservoir capacitor from the difference between the first measure and the second measure, based on the known value of the second fixed current;
    comparing the capacitance value of the reservoir capacitor to a threshold; and
    if the capacitance value is below said threshold, triggering an alarm signal indicating so.

2. A device for diagnosing a reservoir capacitor of a vehicle safety system, the device comprising:
- a supply voltage generating circuit arranged to load the reservoir capacitor up to a given voltage value;
- a current sink arranged to selectively discharge the reservoir capacitor with a given fixed current of known value; and
- a control unit arranged to:
  - obtain a first measure of a discharge rate of the reservoir capacitor when discharging the capacitor by a first undetermined current; and,
  - after the reservoir capacitor has been reloaded up to the given voltage value by the voltage supply, obtain a second measure of the discharge rate of the reservoir capacitor when discharging said capacitor by the first current and by said given fixed current added to said first current by the current sink;
  - determine the capacitance value of the reservoir capacitor from the difference between the first measure and the second measure, based on the known value of the given fixed current of the current sink; and
  - compare the capacitance value of the reservoir capacitor to a threshold and, if the capacitance value is below said threshold, trigger an alarm signal indicating so.

3. A vehicle safety system comprising:
- a battery;
- an actuating device;
- a reservoir capacitor arranged to supply power to said actuating device in replacement of the battery when needed; and,
- a diagnosing device implemented to diagnose the reservoir capacitor, arranged to detect whether enough energy is available or not in said reservoir capacitor for actuating the actuating device, wherein said diagnosing device comprises
  - a supply voltage generating circuit arranged to load the reservoir capacitor from a battery voltage supplied by the battery, up to a first given voltage value,
  - a current sink arranged to selectively discharge the reservoir capacitor with a second fixed current of known value;
  - a control unit arranged to:
    - obtain a first measure of a discharge rate of the reservoir capacitor when discharging the reservoir capacitor by a first undetermined current,
    - after the reservoir capacitor has been reloaded up to the first given voltage value by the supply voltage generating circuit, obtain a second measure of the discharge rate of the reservoir capacitor when discharging said capacitor by the first undetermined current and by the second fixed current added to said first undetermined current by the current sink,
    - determine the capacitance value of the reservoir capacitor from the difference between the first measure and the second measure, based on the known value of the given fixed current of the current sink, and
    - compare the capacitance value of the reservoir capacitor to a threshold and, if the capacitance value is below said threshold, trigger an alarm signal indicating so.

4. The system of claim 3, wherein the supply voltage generating circuit further comprises:
- a voltage elevating structure having an input coupled to the battery and an output, and wherein the voltage elevating structure is arranged to generate, from the battery voltage, the first given voltage value on said output, the reservoir capacitor being connected to said output of said voltage elevating structure.

5. The system of claim 4, wherein the voltage elevating structure is arranged to form a Boost converter comprising an inductor, a diode and the reservoir capacitor.

6. The system of claim 5, wherein the inductor and the diode are external to the supply voltage generating circuit.

7. The system of claim 4, wherein the supply voltage generating circuit further comprises a voltage lowering structure with an input connected to the output of the voltage elevating structure and an output, and arranged to generate, from the first given voltage value, a second given voltage value on said output of the voltage lowering structure, said second given voltage value being lower than said first given voltage value.

8. The system of claim 7, wherein the voltage lowering structure is arranged to form a Buck converter comprising an inductor and a capacitor.

9. The system of claim 8, wherein the inductor and the capacitor of the Buck converter are external to the supply voltage generating circuit.

10. The system of claim 8, wherein the first undetermined current includes the input current absorbed by the Buck converter.

11. The system of claim 8, wherein the supply voltage generating circuit further comprises at least one voltage regulator arranged to deliver, from the second given voltage value, a regulated supply voltage suitable for supplying power to another device of the vehicle safety system.

12. The system of claim 3, further comprising:
- a drive circuit arranged to generate a signal for actuating the actuating device and comprising a switch arrangement having a high side switch and a low side switch; and
- a main switch in series with the high side switch and the low side switch and external to the drive circuit, said main switch being connected to the current sink, for switching on and off the current sink.

13. The system of claim 3, wherein the reservoir capacitor comprises at least three elementary capacitors connected in parallel.

14. The system of claim 13, wherein each elementary capacitor has a value of up to 7 mF.

15. The system of claim 3, wherein the second fixed current is in the range of a few tens milli-Amps, such as 50 mA.

16. The system of claim 3, wherein the first given voltage value is more than 20 Volts.

* * * * *